(12) United States Patent
Jaffa

(10) Patent No.: US 7,436,347 B2
(45) Date of Patent: Oct. 14, 2008

(54) QUANTISER PROVIDING ADAPTIVE QUANTISATION STEPS WITH CYCLIC STORAGE

(76) Inventor: David Asher Jaffa, 5 Atlantic House, 128 Albert Steet, London NW1 7NE (GB)

(*) Notice: Subject to any disclaimer, the term of this patent is extended or adjusted under 35 U.S.C. 154(b) by 0 days.

(21) Appl. No.: 10/592,144

(22) PCT Filed: Jan. 31, 2005

(86) PCT No.: PCT/EP2005/050400

§ 371 (c)(1), (2), (4) Date: May 11, 2007

(87) PCT Pub. No.: WO2005/086135

PCT Pub. Date: Sep. 15, 2005

(65) Prior Publication Data

US 2007/0279273 A1    Dec. 6, 2007

(30) Foreign Application Priority Data

Mar. 10, 2004  (GB) .................... 0405420.1

(51) Int. Cl.
  *H03M 7/26* (2006.01)
(52) U.S. Cl. ............................ 341/200; 341/155
(58) Field of Classification Search ............ 341/50–70, 341/200
  See application file for complete search history.

(56) References Cited

U.S. PATENT DOCUMENTS

| | | | | |
|---|---|---|---|---|
| 6,784,812 B2* | 8/2004 | Craven et al. | ............ | 341/50 |
| 6,943,710 B2* | 9/2005 | Marpe et al. | ............ | 341/106 |
| 7,126,500 B2* | 10/2006 | Adams et al. | ............ | 341/50 |
| 7,193,542 B2* | 3/2007 | Jegou et al. | ............ | 341/67 |
| 7,215,265 B2* | 5/2007 | Guionnet et al. | ............ | 341/107 |
| 7,280,052 B2* | 10/2007 | Levy | ............ | 341/51 |
| 2004/0125003 A1* | 7/2004 | Craven et al. | ............ | 341/76 |

FOREIGN PATENT DOCUMENTS

WO  WO 01/31610  5/2001

OTHER PUBLICATIONS

Ortega, A., et al., "Adaptive Scalar Quantization without Side Information", IEEE Transactions on Image Processing, IEEE Inc., New York, US, vol. 6, No. 5, May 1997, pp. 665-676.

* cited by examiner

*Primary Examiner*—Lam T Mai
(74) *Attorney, Agent, or Firm*—Harrington & Smith PC

(57) ABSTRACT

In one exemplary embodiment, an adaptive quantiser includes: an input; a memory configured to store a representation of the distribution of the quantiser output for an expected input signal; a data recording configuration operable to record the actual input signal over a period that is statistically significant, the data recording configuration comprising an analogue-to-digital converter and a second memory configured to cyclically store the output of the analogue-to-digital converter; and a processor configured to set quantisation steps in dependence on the recorded input signal so that the quantiser output distribution tends to match said represented distribution.

27 Claims, 12 Drawing Sheets

QUANTISER PROVIDING ADAPTIVE QUANTISATION STEPS WITH CYCLIC STORAGE

TECHNICAL FIELD

The present invention relates to an adaptive quantiser.

BACKGROUND

Quantisers in general are well-known. A quantiser receives an input signal and produces an output signal that indicates into which, of a set of amplitude ranges, the input signal falls. A typical application of a simple quantiser is in an analogue-to-digital converter in which the sizes of the ranges, or "quantisation steps", are set by the precision of the output digital signal and the acceptable input signal range. However, the quantisation steps need not all be the same size. For example, an analogue-to-digital converter can be used as a speech compressor by making the quantisation steps smaller for large input signals than for small input signals.

SUMMARY

The present inventor has perceived a need for a quantiser that can adapt the sizes of its quantisation steps on the basis of a statistical model of the expected output signal. This enables compensation of unwanted systemic gain variations and non-linearities.

According to the present invention, there is provided an adaptive quantiser comprising:

an input;
means storing a representation of the distribution of the quantiser output for an expected input signal;
means for recording actual the input signal over a period that is statistically significant;
processing means for setting quantisation steps in dependence on the recorded input signal so that the quantiser output distribution tends to match said represented distribution. The processing means may be a custom circuit or a programmed processor.

According to the present invention, there is also provided a system for grading individuals' performances, e.g. test scores or employee review score, comprising:

an input for receiving information representing individuals' performances;
a memory for storing a representation of the expected distribution of individuals' grades output;
means for recording the actual performances, represented by information received by the input means, over a period that is statistically significant;
processing means for setting grade boundaries in dependence on the recorded actual performances so that the output grade distribution tends to match said represented expected distribution.

One embodiment of the present invention is a system for grading students' academic performances comprising:

an input for receiving information representing students' scores for a test;
a memory for storing a representation of the expected distribution of students' grades for said test output;
means for recording the actual scores, represented by information received by the input means, over a period that is statistically significant;
processing means for setting grade boundaries in dependence on the recorded actual scores so that the output grade distribution tends to match said represented expected distribution.

The means for recording an input signal may comprises an analogue-to-digital converter means and memory means configured for cyclically storing the output of the analogue-to-digital converter.

The representation of the expected output distribution may comprise an array of probabilities for the quantiser output or grades, or a percentile value for each quantisation level or grade.

The processing means may be configured to vary the quantisation steps or grades such that applying the recorded signal/performances/scores to the varied steps produces said represented distribution. Alternatively, the processing means may be configured to allocate a quantisation step or grade to an input signal value/performance/score in dependence on the percentile of the input signal value/performance/score in the recorded input signal/performances/scores and the percentile values of the quantisation levels or grades.

The input may be configured to received inputs from a plurality of different sources. The inputs from different sources are considered to be one input signal. The input may comprise means for extracting HTML form data from an http request. It will be appreciated that a measuring instrument could construct an http request and encode measurements in the request in the manner of form data, using either the GET or POST methods.

BRIEF DESCRIPTION OF THE DRAWINGS

Embodiments of the present invention will now be described, by way of example, with reference to the accompanying drawings, in which.

DETAILED DESCRIPTION

Figure 1:
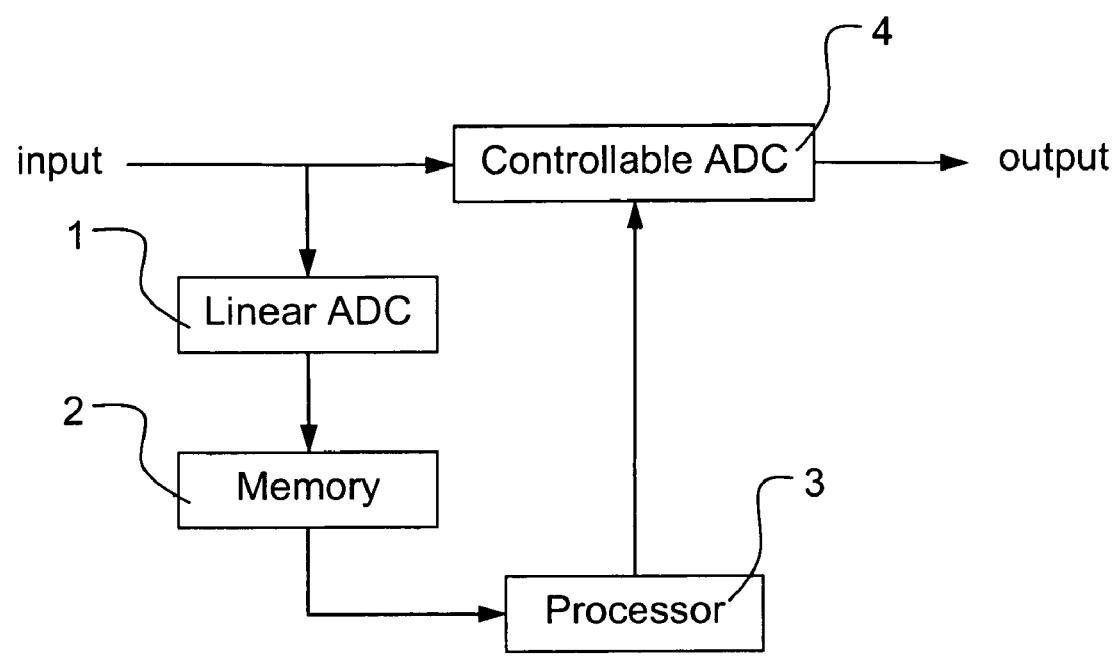
FIG. 1 is a block diagram of a speech processor according to the present invention.

Referring to FIG. 1, a speech processor according to the present invention, comprises a linear analogue-to-digital converter (ADC) 1, a memory 2, a processor 3 and a controllable analogue-to-digital converter 4.

Input analogue signals are digitised by the linear ADC 1 and written cyclically to the memory 2. The input analogue signals are also fed to the controllable ADC 4. Initially, the quantisation steps of the controllable ADC 4 are set to default ranges. For example, the heights of the quantisation steps of the controllable ADC 4 may all be the same.

The processor 3 can send control signals to the controllable ADC 4 to set controllable ADC's quantisation steps. The quantisation step control signal are generated by the processor 3 by analysing the input signals in a moving window. The width of the moving window corresponds to the period of the cyclical writing of output data from the linear ADC 1 to the memory 2.

Figure 2:
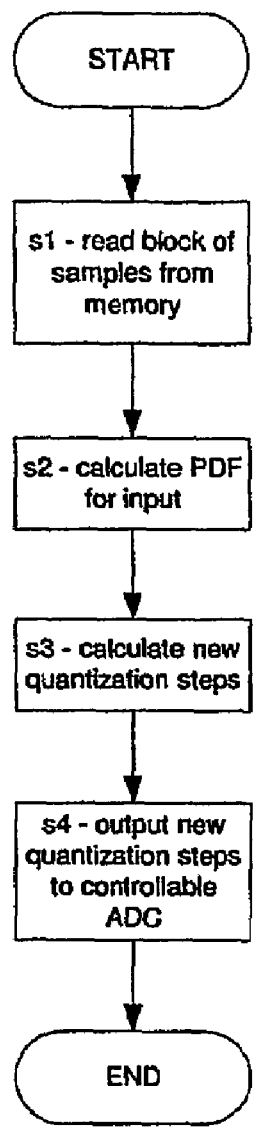
FIG. 2 is a flowchart of the quantisation step determining process performed in the processor of FIG. 1.

Referring to FIG. 2, at intervals, the processor 3 reads a block of input signal samples from the memory 2 (step s1).

Figure 3:
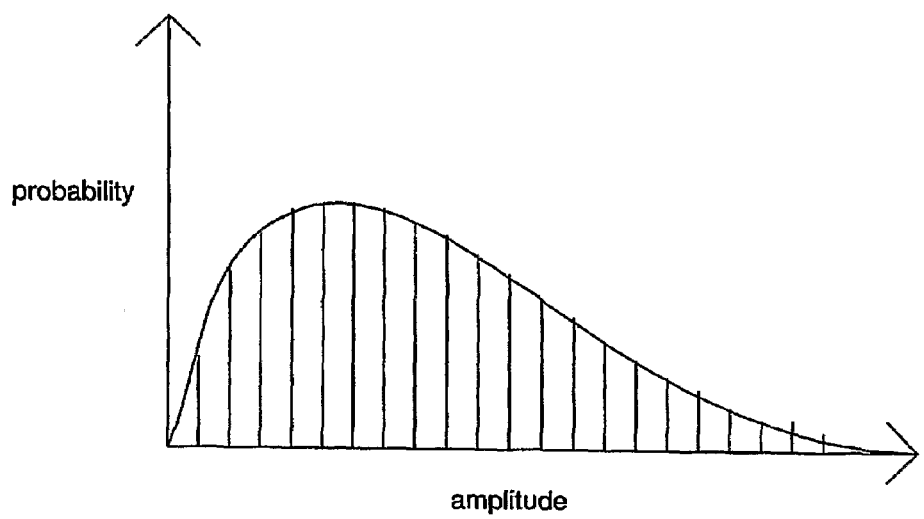
FIG. 3 is a graph illustrating the probability density function of an expected input signal.

Referring to FIG. 3, the probability density function expected for the input signal, can be divided into regions by vertical lines from the amplitude axis. These lines correspond to the boundaries between quantisation steps of a linear quantiser. The probability that an expected input signal sample will fall within a particular quantisation level is given by the area bounded by the probability curve and the vertical lines at the upper and lower limits of the level.

The processor 3 is programmed with an array ("the model array") containing the quantisation level probabilities for a predetermined speech signal probability density function. In other words, the nth element of the model array defines the desired probability of the output of the controllable quantiser being the nth value when the input signal is the expected input signal, i.e. an input signal without undesirable gain and linearity effects.

Referring back to FIG. 2, the processor calculates an amplitude probability density function for the input signal from the samples, read from the memory 2 (step s2). This may be done by building a representation of a histogram, ignoring silences, and fitting a curve to the histogram.

Figure 4:
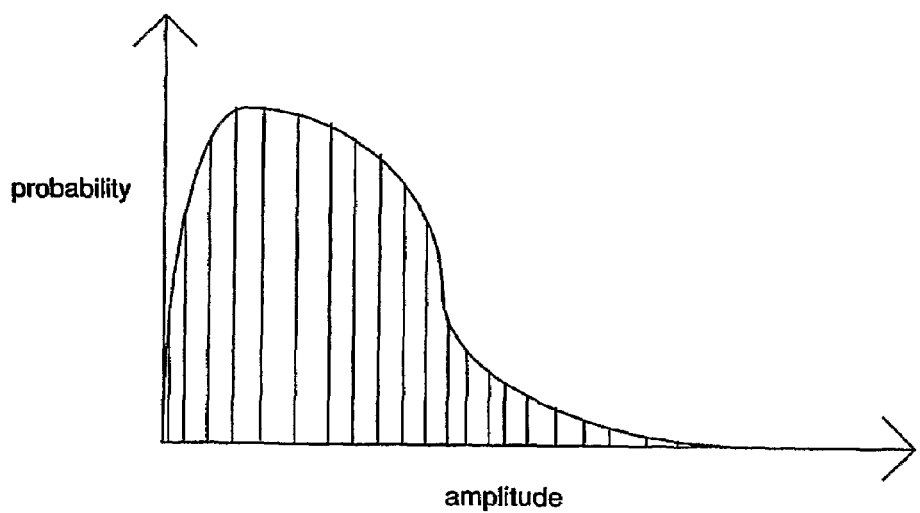
FIG. 4 is a graph illustrating the probability density function of an actual input signal.

For the sake of the present explanation only, the amplitude probability density function of the input signal can be considered to be as shown in FIG. 4. The distribution shown in FIG. 4 is biased towards smaller amplitudes when compared with the distribution shown in FIG. 3. This is consistent with attenuation. Also, the shape of the curve is not a linear transformation of the curve in FIG. 3, which indicates some non-linearities in the signal path to the input of the speech processor.

Once the amplitude probability density function of the input signal has been calculated in step s2, the new quantisation steps for the controllable ADC 4 are determined (step s3).

Figure 5:
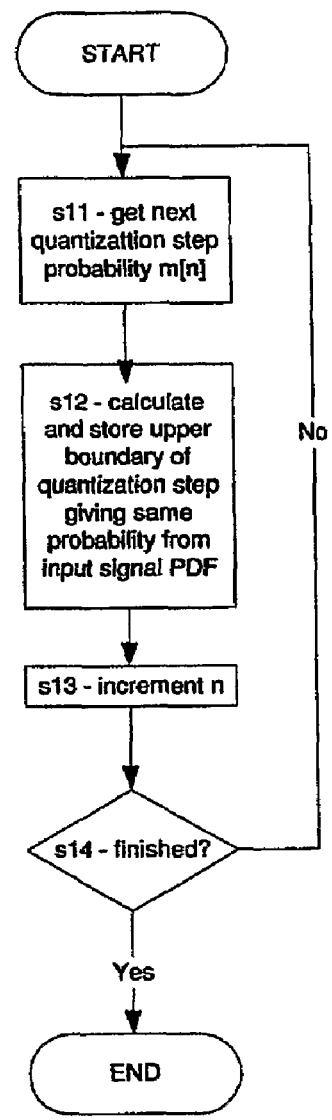
FIG. 5 is a flowchart of the new quantisation step calculation step of the processing illustrated in FIG. 2.

Referring to FIG. 5, the first step of the determination of the new quantisation steps comprises obtaining the next, i.e. the first, element of the model array (step s11). A quantisation step upper bound is then determined by finding the amplitude value such that the area under the amplitude probability density function of the input signal between the previous upper bound, which is 0 in the case of the first step, and the upper bound of the current step equals or approximates the currently selected element of the model array (step s12). Expressed mathematically, the value of $b_n$ that gives:

$$0 = \int_{A=b_{n-1}}^{b_n} f(p) dA - m(n)$$

or $$0 \approx \int_{A=b_{n-1}}^{b_n} f(p) dA - m(n)$$

is required, where $f(p)$ is the amplitude probability density function of the input signal, A is the input signal amplitude, m is the model array, b is a quantisation step boundary and n is the index of the current quantisation step.

The new boundary is stored and the model array index incremented (step s13). If the model array index has passed the end of the model array, the process ends, otherwise the process returns to step s11 for processing of the next quantisation step.

Referring back to FIG. 2, the new quantisation steps are sent by the processor 3 to the controllable ADC 4 (step s4) which sets its quantiser according to the new steps.

In a variant, the model array stores percentiles for the quantisation levels and the quantisation steps are set by moving the thresholds of the controllable quantiser so that the percentiles in the model are achieved with the actual input signal.

The problem of unwanted systemic gain variations and non-linearities also occurs in the grading of educational examination results. If the pool of test takers is sufficiently large, the characteristics of the examination sitters as a group can be considered to be constant over a period of time. However, the examination questions do vary in difficulty over time. Therefore, the unwanted systemic gain variations and non-linearities can be attributed to differences in the difficulties of the examination questions.

In large scale public examinations, the examination grades, e.g. A, B, C etc., are allocated to different ranges of marks retrospectively on the basis of the distribution of marks obtained by the entire set of examination sitters. Consequently, there has been a problem in providing graded results to students sitting "mock" examinations individually within an extended period of time. This problem is particularly apparent where the "mock" examinations are set and graded automatically.

A solution to this problem is, however, provided by an adaptive quantiser according to the present invention.

A simple embodiment will be described first. The simple embodiment enables students to answer questions in one subject at one academic level.

Figure 6:
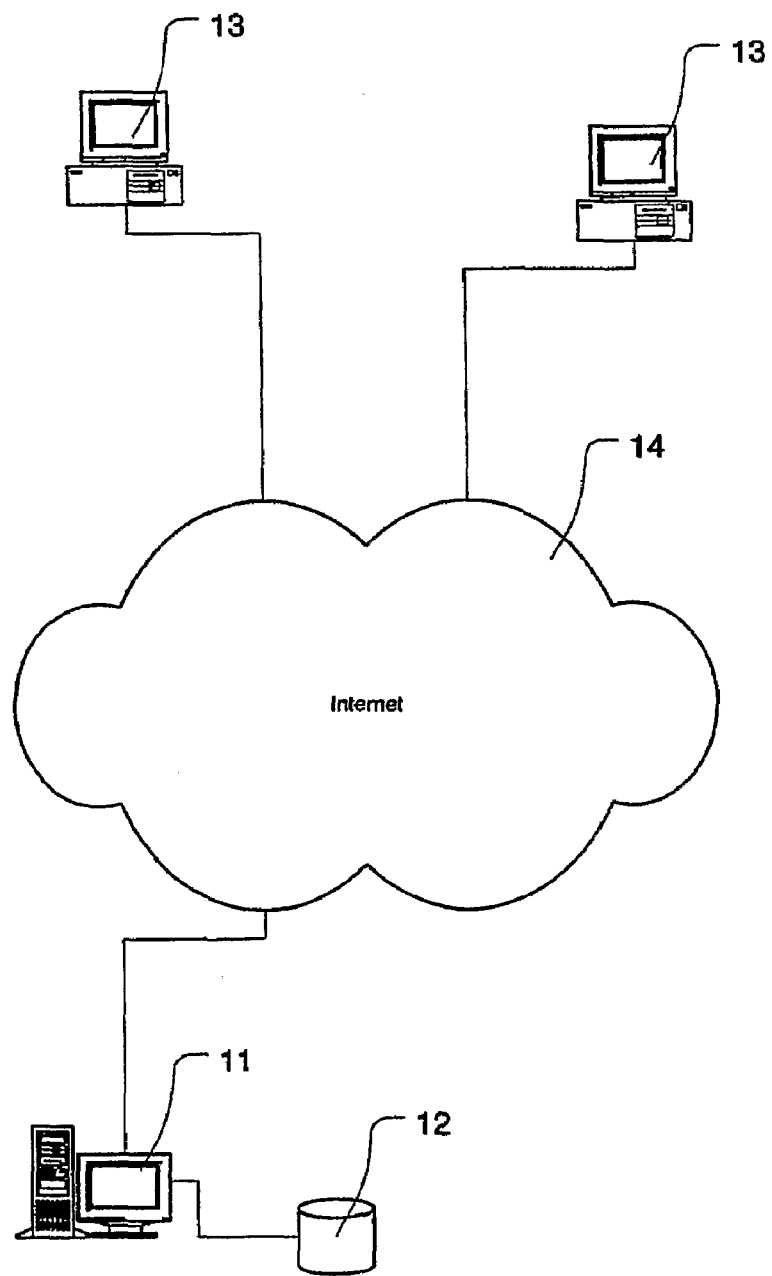
FIG. 6 illustrates the major physical components of an online testing system for students, according to the present invention.

Referring to FIG. 6, an online testing system comprises a web server machine 11 and a database machine 12 connected by a local area network. The client machines 13 can communicate with the web server machine 11 across the Internet 14.

The web server machine 11 runs a conventional web server program, such as Apache, with a server-side scripting language, such as PHP or ASP providing dynamic content. A conventional SQL database system, such as MySQL or Microsoft SQL Server, runs on the database machine 12.

Figure 7:
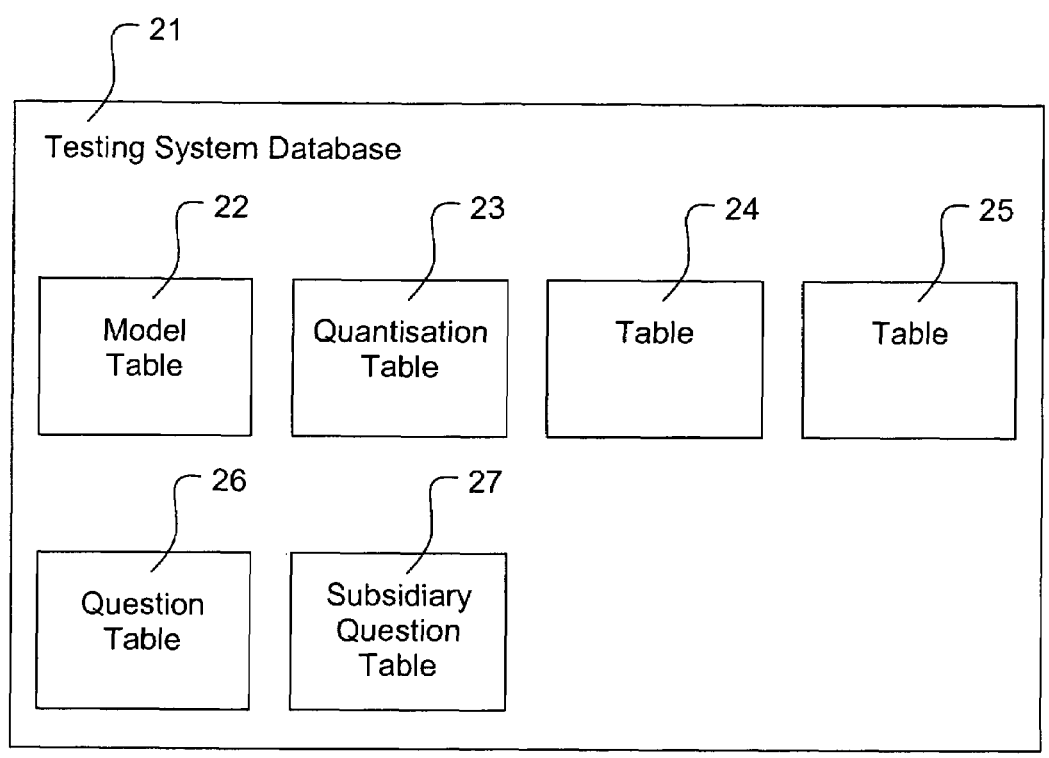
FIG. 7 illustrates the database of the system shown in FIG. 6.

Referring to FIG. 7, the database system includes a testing system database 21. The testing system database includes a plurality of tables comprising a Model Table 22 and a Quantisation Table 23.

The Model Table 22 stores a representation of the grade boundaries in terms of the percentiles for the upper boundary of each grade and corresponds to the model array in the first embodiment described above. The Model Table 22 contains columns for Grade and Boundary. The grade boundary is stored as the percentage of students who fell in or below the grade. For example, for grade U (the bottom grade), the boundary is 5%, for grade F, the boundary is 10%, for grade E, the boundary is 20% and so on until for grade A, the boundary is 100%.

The Quantisation Table 23 provides a mapping between students' scores on a particular question on the one hand and grades on the other. The Quantisation Table 23 comprises a Question ID column, a Possible Percentage column, a Count of Score column, a Cumulative Count of Score column, a Grade column and a Percentile for Possible Score column.

The Question ID column merely identifies the question to which the data in the other columns relates.

Typically a single question will not have 100 marks allocated to it. It is likely to be the case that a question has from four to 20 marks allocated to it. If a question has four marks allocated, a student can score 0%, 25%, 50%, 75% or 100%. Likewise, if a question has 20 marks allocated to it, a student can score 0%, 5%, 10%, 15%, etc. For a given question, there is a row in the Quantisation Table 23 for each possible score. These possible scores are stored in the Possible Percentage column.

The Count of Score column contains counts of the number of times each question/percentage score combination has occurred.

The Cumulative Count of Score column contains the sum of Count of Score column values for the question identified in the Question ID column.

The Possible Percentage Score in the Possible Percentage Column is mapped onto a Grade. The Grade is defined by the contents of the Grade column.

The Percentile for Possible Score column contains the percentile of students attempting the identified question who achieved the score to which the row relates.

The database also comprises a Question Table 26 which contains columns for Question ID and Main Question Text and a Subsidiary Question Table 27 which contains a column for the id of the question in the Question Table 26 to which a subsidiary question belongs, a Text column and an Answer column.

A process by which a student can take a test and receive a grade will now be described.

Figures 8, 9:
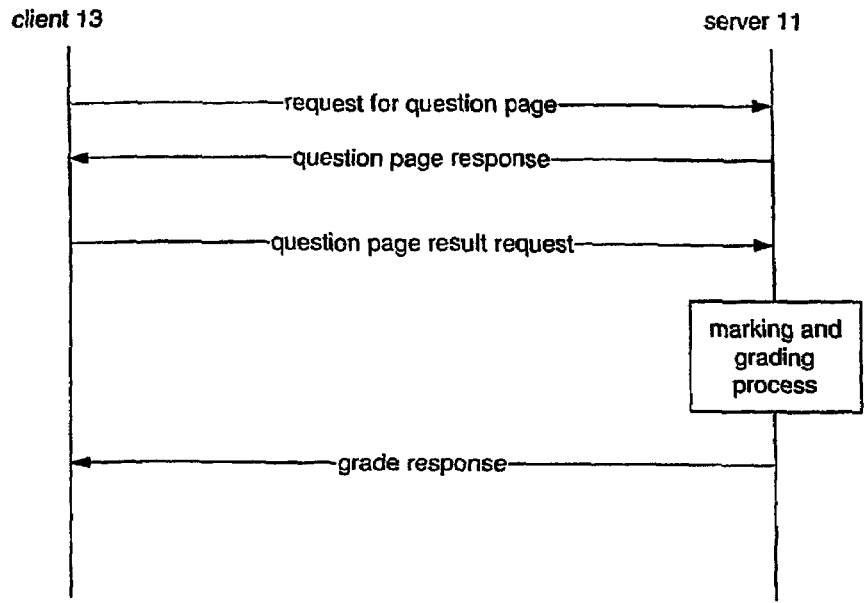
FIG. 8 is a signalling diagram illustrating the signalling between a client and the server in the system shown in FIG. 6.
FIG. 9 shows a question web page.

Referring to FIG. 8, to initiate a question answering session, a student causes their web browser to send an http request for a question page from a client machine 13 to the server machine 11. The server machine 11 responds by sending the requested page in an http response.

Referring to FIG. 9, the question page is displayed by the student's browser and, in the present example, comprises introductory question text 31, six subsidiary question sections 32-1, ..., 32-6 and a submit button 34. Each subsidiary question section comprises a subsidiary question text and four answer option with associated radio buttons.

The student reads the introductory question text 31 and the subsidiary question texts and selects the radio buttons beside the answers that they believe to be correct. The student may change their mind and select other radio buttons at this point. When the student is finally satisfied with their selections, the student clicks on the submit button 34.

The clicking on the submit button 34 causes the student's web browser to send the identities of the selected radio buttons to the web server machine 11 in a request for a resource, defined in the action parameter of the HTML form in the question page.

Figure 10:
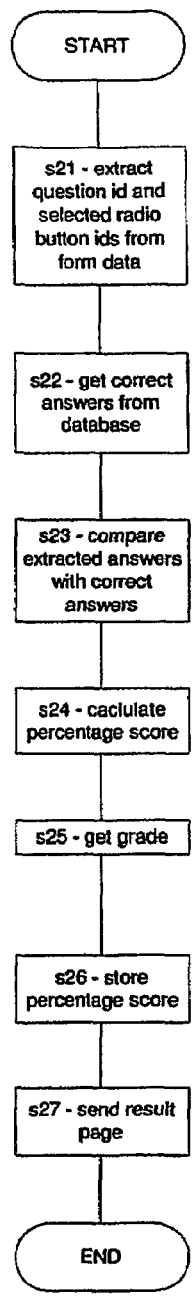
FIG. 10 is a flowchart illustrating the marking of a question answered by a student.

Referring to FIG. 10, when the request for the resource, defined in the action parameter of the HTML form in the question page, is received by the web server machine 11, it is processed to obtain the form data and, in particular, the id of the question and the values of the selected radio buttons (step s21).

The main and Subsidiary Question Tables 26, 27 are queried to obtain the correct answer values for the identified question (step s22). The values from the form data are compared with the correct values (step s23) and an approximate percentage score, i.e. 0%, 17%, 33%, 50%, 66%, 83% or 100%, is calculated according to the number of correct answers to the subsidiary questions (step s24).

The grade for the calculated percentage score and the question is then obtained from the Quantisation Table (step s25). The student's percentage score is stored (step s26) and a new page is sent to the student as the response to the request carrying the form data (step s27). The student's grade is included in the response page in this example.

It will be appreciated that conventional session management techniques can be used to present a question over a plurality of pages.

The process of generating this mapping will now be described.

At intervals, for example nightly, a quantisation step update process is performed.

Figure 11:
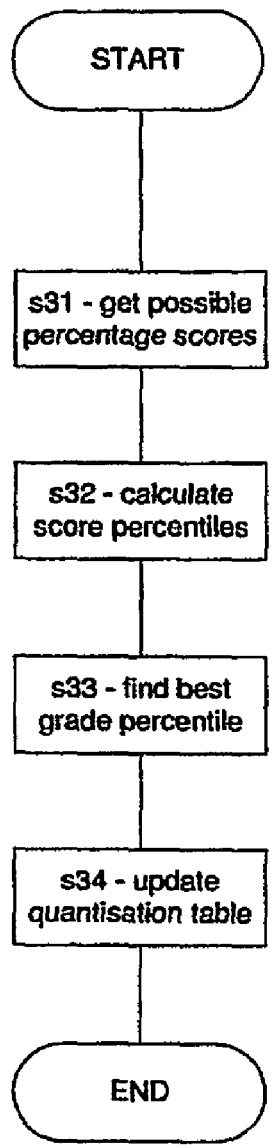
FIG. 11 is a flowchart illustrating a quantiser updating process.

Referring to FIG. 11, the quantisation step update process starts with the possible percentage scores for a question being obtained from the database 21 (step s31). The percentile for each of these possible scores is then calculated from the records of students' scores recorded in the Quantisation Table 23 of database 21 within a moving window (step s32).

For each of the possible score percentiles, the closest grade percentile above the current score percentile is obtained from the grade boundary table 23 (step s33). These values are then used to update the grade values in the Quantisation Table 22 (step s34).

Thus, the grade allocated to a particular percentage score depends on the historical record of that score being achieved and the desired grade percentiles.

The foregoing embodiment has been made deliberately simple so that the adaptive quantisation process can be more readily understood. A more complex system which is more desirable in practice will now be described.

In this more complex embodiment, the hardware is substantially as described above with reference to FIG. 6. However, the processing by the server machine 11 is more complex. The web server, running on the server machine 11, is programmed to provide login pages, question pages and report pages using data from the database machine 12. The logging in members, session handling and the production of web pages from data sources are familiar tasks to any one skilled in the art of web application design. The members may be students or teachers, although only students will perform the test exercises.

Figure 12:
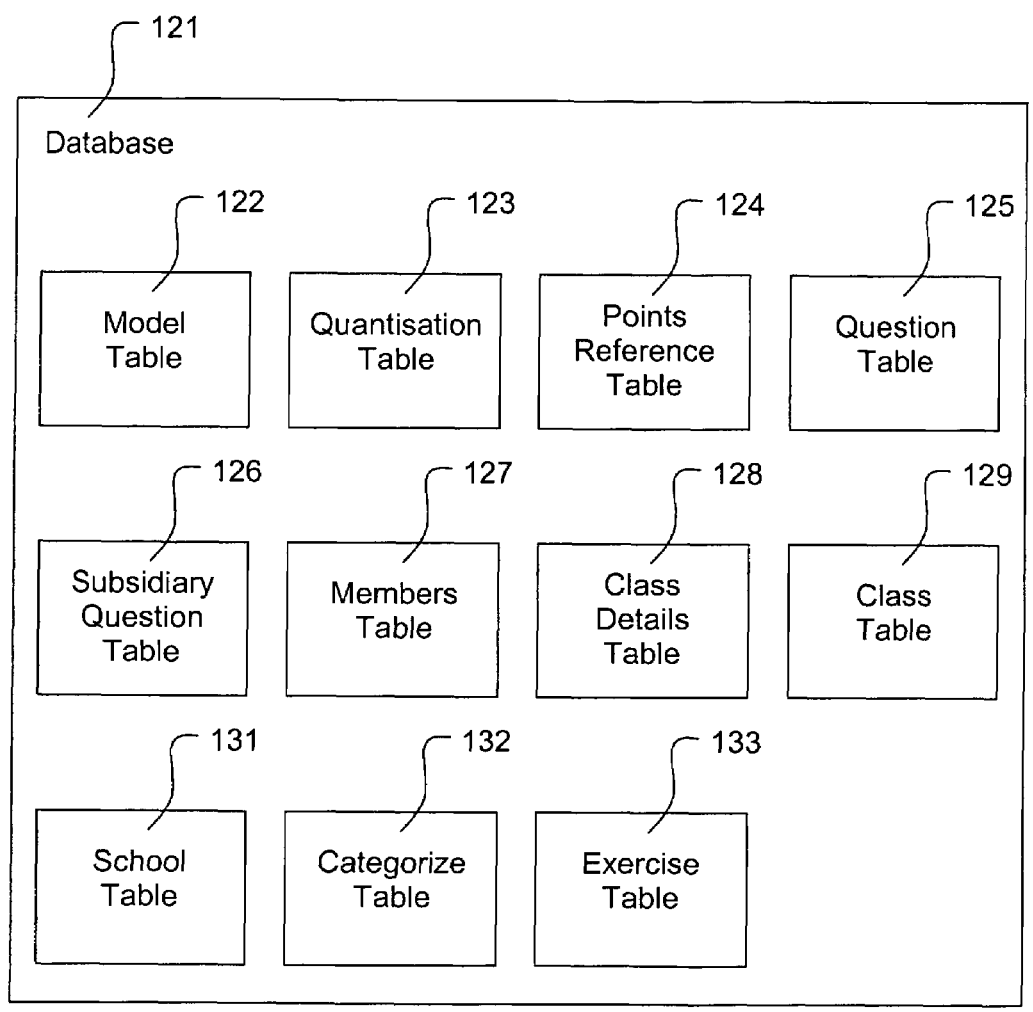
FIG. 12 illustrates the database of a more sophisticated system of the type shown in FIG. 6.

Referring to FIG. 12, the database 121 of this embodiment contains extended versions of the tables of the preceding embodiment and some additional tables. The tables are a Model Table 122, a Quantisation Table 123, a Points Reference Table 124, a Question Table 125, a Subsidiary Question Table 126, a Members Table 127, a Class Details Table 128, a Class Table 129, a School Table 131, a Categorize Table 132 and an Exercise Table 133.

The Members Table 127 comprises columns for a member id, member personal details, user id and password for accessing the system, a school reference to the School Table 131, and member type, e.g. student or teacher.

The Class Table 129 comprises a School Reference column containing references to the School Table 131 and a Code column. The Class Details Table 128 merely provides a link between a member id in the Members Table 127 and class code in the Class Table 129.

The Exercise Table 133 contains columns for a member id, an exercise id and a reference to a record in the Quantisation Table 123.

The Categorize Table 132 stores a record of members' performances in the exercises that they have undertaken. The columns of the Categorize Table 132 include an ID column, a Year column, Subject, Heading, Topic, Subtopic and Type columns for information relating to exercises, a column for references to the Exercise Table 133, columns for the time and duration of an exercise and columns for grade and points.

The Quantisation Table 123 comprises columns for Question ID, Academic Level, Possible Percentage Score, Count of Score, Count of Attempts at Question, Lower and Upper Grades, Possible Point Score, Percentile for Possible Score and Question Subject.

The Model Table 122 has columns for Academic Level, Subject, Grade and Grade Boundary Percentile.

Finally, the Points Reference Table 124 has Academic Level, Grade and Points columns.

The skilled person will readily understand how the information stored in the tables can be used to generate web pages reporting members', classes' or schools' performances.

When a member completes an exercise, the member submits the question form.

Referring to FIG. 12, when the form data is received by the web server, the relevant program or script extracts the member's id, the time taken, which may be determined by a Javascript counter, a Question ID and the selections made in answer to the question (step s41).

The percentage score is calculated (step s42). The Count of Attempts at Question fields of the Quantisation Table records, having the extracted Question ID, are incremented (step s43) and the record for that Question ID and the calculated Percentage Score combination is obtained from the Quantisation Table 123 (step s44).

A record is next created in the Categorize Table 132 using information about the question from the Question Table 125 (step s45). The grade field is set from the upper grade field of the Quantisation Table record and the points field is set from the possible point score field of the Quantisation Table record.

Finally, the program or script sends the appropriate response page to the member's client machine 13.

At intervals, the Quantisation Table 123 is updated. In particular, the Upper and Lower Grades and the Possible Point Score columns are updated.

Figure 13:
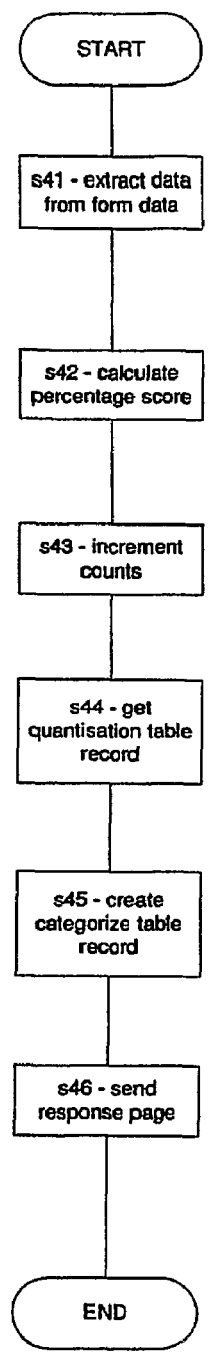
FIG. 13 is a flowchart illustrating the marking of a question answered by a student.
Figure 14:
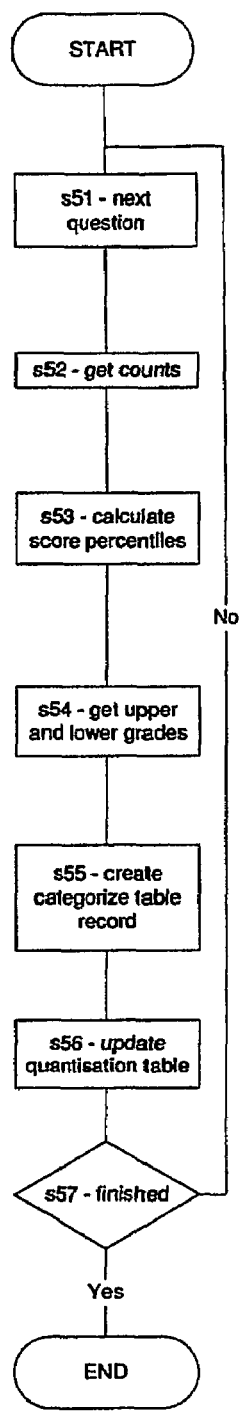
FIG. 14 is a flowchart illustrating a quantiser updating process.

Referring to FIG. 13, the Quantisation Table updating process is carried out for each question (steps s51 and s57). Counts of the number of times each possible score was achieved in a moving window, consisting of the preceding three months, are obtained from the Categorize Table (step s52). From these counts, the percentiles for each possible score is calculated (step s53). These percentiles are then compared with the grade boundary percentiles from the Model Table 122 to get the Upper and Lower Grades for the Quantisation Table 123 (step s54). The points for the new Upper and Lower Grades for the question's academic level are obtained from the Points Reference Table 124 and averaged to produce a new possible points score (step s55). The new Upper and Lower Grades and the new Possible Points Score are used to update the Quantisation Table record for the current question/percentage score combination (step s56).

Thus, both the grading and the allocation of points are determined on the basis of a historical record of inputs and the desired output distribution.

In a variant of this embodiment, the member is asked an open-ended question in a first web page and provided with a marking schedule in a second page. The second page includes checkboxes which enable the member to identify the items in the marking schedule that the member included in their answer. When the form data from the second page is received by the web server, the percentage score is determined by the number of boxes that the member checked. Once the percentage score has been determined, the grading proceeds as shown in FIG. 13.

It will be appreciated that an adaptive quantiser can be applied in may situations where a signal is subject to systemic amplitude noise and can be characterised statistically. For example the adaptive quantiser can be used to grade employee performance on a relative basis in a corporation.

The invention claimed is:

1. An adaptive quantiser comprising:
   an input;
   a memory configured to store a representation of the distribution of the quantiser output for an expected input signal;
   a data recording configuration operable to record the actual input signal over a period that is statistically significant, the data recording configuration comprising an analogue-to-digital converter and a second memory configured to cyclically store the output of the analogue-to-digital converter; and
   a processor configured to set quantisation steps in dependence on the recorded input signal so that the quantiser output distribution tends to match said represented distribution.

2. An adaptive quantiser according to claim 1, wherein said representation comprises an array of probabilities for each quantiser output value.

3. An adaptive quantiser according to claim 1, wherein said representation comprises a percentile value for each quantisation level.

4. An adaptive quantiser according to claim 2, wherein the processor is configured to vary the quantisation steps such that applying the recorded signal to the varied steps produces said represented distribution.

5. An adaptive quantiser according to claim 2, wherein the processor is configured allocate a quantisation step to an input signal value in dependence on the percentile of the input signal value in the recorded input signal and the percentile values of the quantisation levels.

6. An adaptive quantiser according to claim 5, wherein the input is configured to receive inputs from a plurality of different sources.

7. An adaptive quantiser according to claim 6, wherein the input comprises a program or script configured to extract HTML form data from an http request.

8. A system for grading individuals' performances comprising:
   an input configured to receive information representing individuals' performances;
   a memory configured to store a representation of the expected distribution of individuals' grades output, wherein said representation comprises an array of probabilities for each possible grade output; and
   a processor configured to record the actual performances, represented by information received by the input, over a period that is statistically significant and to set grade boundaries in dependence on the recorded actual performances so that the output grade distribution tends to match said represented expected distribution.

9. A system according to claim 8, wherein the processor is configured allocate a grade to an input individual's performance in dependence on the percentile of the individual's performance in the recorded individuals' performances and the percentile values of the grades.

10. A system according to claim 8, wherein the processor is configured to vary the grade boundaries such that applying the recorded performances to the varied grade boundaries produces said represented grade distribution.

11. A system according to claim 10, wherein the input is configured to receive inputs from a plurality of different sources.

12. A system according to claim 11, wherein the input comprises a program or script configured to extract HTML form data from an http request.

13. A system according to claim 8, wherein said representation comprises a percentile value for each grade.

14. A system according to claim 13, wherein the processor is configured to vary the grade boundaries such that applying the recorded performances to the varied grade boundaries produces said represented grade distribution.

15. A system according to claim 13, wherein the processor is configured allocate a grade to an input individual's performance in dependence on the percentile of the individual's performance in the recorded individuals' performances and the percentile values of the grades.

16. A system according to claim 15, wherein the input is configured to receive inputs from a plurality of different sources.

17. A system according to claim 16, wherein the input comprises a program or script configured to extract HTML form data from an http request.

18. A system for grading students' academic performances comprising:
an input configured to receive information representing students' scores for a test;
a memory configured to store a representation of the expected distribution of students' grades for said test output, wherein said representation comprises an array of probabilities for each possible grade output; and
a processor configured to record the actual scores, represented by information received by the input, over a period that is statistically significant and to set grade boundaries in dependence on the recorded actual scores so that the output grade distribution tends to match said represented expected distribution.

19. A system according to claim 18, wherein the processor is configured allocate a grade to an input student's score in dependence on the percentile of the student's score in the recorded students' scores and the percentile values of the grades.

20. A system according to claim 18, wherein the processor is configured to vary the grade boundaries such that applying the recorded scores to the varied grade boundaries produces said represented grade distribution.

21. A system according to claim 20, wherein the input is configured to receive inputs from a plurality of different sources.

22. A system according to claim 21, wherein the input comprises a program or script configured to extract HTML form data from an http request.

23. A system according to claim 18, wherein said representation comprises a percentile value for each grade.

24. A system according to claim 23, wherein the processor is configured to vary the grade boundaries such that applying the recorded scores to the varied grade boundaries produces said represented grade distribution.

25. A system according to claim 23, wherein the processor is configured allocate a grade to an input student's score in dependence on the percentile of the student's score in the recorded students' scores and the percentile values of the grades.

26. A system according to claim 25, wherein the input is configured to receive inputs from a plurality of different sources.

27. A system according to claim 26, wherein the input comprises a program or script configured to extract HTML form data from an http request.

* * * * *